United States Patent [19]
Bloom

[11] Patent Number: 5,792,984
[45] Date of Patent: Aug. 11, 1998

[54] MOLDED ALUMINUM NITRIDE PACKAGES

[75] Inventor: Terry R. Bloom, Middlebury, Ind.

[73] Assignee: CTS Corporation, Elkhart, Ind.

[21] Appl. No.: 673,992

[22] Filed: Jul. 1, 1996

[51] Int. Cl.$^6$ .................................................. H05K 5/06
[52] U.S. Cl. .................... 174/52.3; 257/705; 257/704;
257/703; 257/698
[58] Field of Search ........................... 174/52.4, 52.2,
174/52.3; 257/676, 684, 690, 698, 694,
695, 702, 705, 704, 703; 361/718, 723,
807, 820

[56] References Cited

U.S. PATENT DOCUMENTS

| | | | |
|---|---|---|---|
| 4,167,647 | 9/1979 | Salera | 174/52.4 |
| 4,266,090 | 5/1981 | Scherer | 174/52.4 |
| 4,412,093 | 10/1983 | Wildeboer | 174/52.4 |
| 4,506,108 | 3/1985 | Kersch et al. | 174/52.4 |
| 5,109,268 | 4/1992 | Butera | 257/705 |
| 5,528,079 | 6/1996 | McIver | 257/698 |
| 5,574,314 | 11/1996 | Okada et al. | 257/728 |

*Primary Examiner*—Kristine L. Kincaid
*Assistant Examiner*—Hung V. Ngo

*Attorney, Agent, or Firm*—Albert W. Watkins; Michael W. Starkweather

[57] ABSTRACT

An aluminum nitride housing is molded which includes open holes that pass through the walls. A lead frame is formed by machining or chemically milling individual leads and details therein to form desired circuitry patterns. The lead frame is inserted through the open holes in the aluminum nitride housing and chemically and mechanically bonded thereto using active braze The active braze attaches the lead frame not only to the open holes in the package, but also to the wall of the housing over a larger area. Active braze forms a strong bond between the aluminum nitride and the lead frame, and also forms an excellent and highly reliable thermal junction therebetween. Several different package constructions are illustrated. In one design the aluminum nitride takes on a bathtub configuration onto which a flat cover may be attached. In an alternative embodiment, a metal seal ring is brazed to a relatively flat aluminum nitride base, which allows prior art roller welding, soldering or brazing of a lid to the seal ring after all devices are installed into the aluminum nitride package. The resultant packages are hermetic, reliable, corrosion resistant, and capable of withstanding extremely high temperatures with no loss of hermeticity.

8 Claims, 5 Drawing Sheets

MOLDED ALUMINUM NITRIDE PACKAGES

BACKGROUND OF THE INVENTION

1. Field of the Invention

This invention pertains generally to microelectronic packages, and specifically to high power, high temperature hermetic packages for microelectronic devices. For the purposes of this disclosure, hermetic packages will be specifically defined to mean gas tight packages exhibiting only minor gas exchange such as would typically occur directly through the walls of a completely sealed metal package. Any direct openings or polymer type seals are specifically excluded from the present definition of hermetic packages.

2. Description of the Related Art

The microelectronics industry needs smaller packages capable of dissipating higher amounts of thermal energy than ever before possible. In addition, reliability of components must be increased, preferably without increasing costs. These often conflicting needs have existed for many years, and will likely exist for many more.

Early efforts at designing high power, high reliability microelectronic packages, still in use today, typically involved the use of metal and metal alloy packages. These packages have metal can exteriors. In order to pass electrical leads through the electrically and thermally conductive package exteriors, small glass beads are inserted into holes that pass fully through the metal exterior. Within the glass beads are small metal wires that pass through the glass beads. The glass beads then act as electrical insulation between each wire and the metal package exterior, and also as a hermetic seal to ensure hermeticity of the package.

While the metal package exterior exhibits very high thermal conductivity, simplifying cooling of any components that may be placed in direct contact with the exterior, the metal is also electrically conductive, as aforementioned. Due to the electrical conductivity, only devices that have electrical insulation may be placed in direct contact with the package exterior. Alternatively, a single electrical device may be encased in the package, using the package exterior for one electrical connection and passing any remaining electrical leads through glass beads in the exterior. One well-known type of package using this design is the TO-3 package used for many years.

Reliability of these prior art metal packages tends to be good. The packages are typically sealed with a weld or solder between opposing halves of the exterior, resulting in a gas-tight enclosure surrounding the electronic component (s). The package may be sealed in a relatively inert gas environment such as dry nitrogen or argon, or may be packaged in a vacuum environment. By sealing the components in this type of hermetic package, corrosive attack of the devices and device interconnections is prevented. Corrosion accelerates greatly as temperature increases, making hermetic packages a necessity for high temperature environments.

The high temperature environment may be a result of the operating temperature of the packaged electronic components or may instead be a result of the environment surrounding the package exterior. Where the temperature is a result of thermal dissipation of the electronic devices, the metal package also helps in dissipating heat into the surroundings.

Unfortunately, when two or more devices are mounted within the metal package and each device requires electrical isolation from the other, the devices must not be placed in direct contact with the metal exterior. These devices are often placed upon a carrier substrate that serves as the electrical isolation. There are very few materials which are electrically insulating and thermally conducting. Even fewer of these materials have been suitable for forming an electrical circuit substrate, which preferably will include electrical circuit traces thereon or therein. Most commonly for higher temperature applications, alumina ($Al_2O_3$) substrates have been used. Alumina forms a compromise between the opposing needs for electrical insulation, thermal conductivity and safe handling. Beryllia substrates, which offer much better thermal conductivity than alumina, have also been used. However, beryllia is a hazardous substance which, due to its toxicity, is being used less and less.

The use of an intervening substrate material reduces the amount of thermal energy that can be dissipated from electronic devices within the package. Moreover, if the intervening substrate is not properly affixed to the metal package, an additional thermal barrier may be introduced. The extra thermal resistance may be sufficient to result in overheating of higher power electronic devices and resultant failure. This occasional failure is equivalent to either poorer field reliability or higher losses during manufacture, depending upon whether the problem is detected at the manufacturing site or in the field. In either case, the failure is undesirable and costly.

Besides the requirement for an intervening substrate, the metal package has another limitation. Where very high current must be passed through the metal exterior, large wires must be passed through the glass beads. The probability for cracking or other hermeticity failure, particularly during large temperature cycles, increases substantially with each increase in wire size passing through the glass bead. Therefore, the metal package is less desirable as higher currents are needed.

Another type of package used in high temperature and high power applications is a molded aluminum nitride package. Aluminum nitride (AlN) has thermal conductivity similar to beryllia. However, aluminum nitride is also non-toxic, like alumina. Aluminum nitride is not, however, well suited to forming circuit traces. The ceramic does not form good chemical bonds to the materials that are standard in the electronics industry. As a result, prior designers have resorted to the use of refractory metallized aluminum nitride.

In the known process, aluminum nitride is molded to the desired package geometry. Refractory metals such as tungsten and molybdenum are patterned upon the aluminum nitride and then the combined aluminum nitride and metal are heated to temperatures often reaching 1,800 degrees Centigrade. While sintering the aluminum nitride into the desired package geometry, a strong bond is formed between the metallization and the aluminum nitride substrate.

While the resultant aluminum nitride package is suitable for lower current applications, the intrinsic electrical resistance of refractory metals is very high. Since the power dissipated by the metal traces is equal to the $I^2R$, the loss for high current applications that results from the high intrinsic resistance of the refractory metals is often intolerable.

SUMMARY OF THE PRESENT INVENTION

A molded aluminum nitride housing includes open holes that pass through the walls. A solid metal lead frame is actively brazed through the open holes in the aluminum nitride housing, and also to a major surface of the base over a large area. The active braze forms a strong bond between the aluminum nitride and the lead frame, and also forms an excellent and highly reliable thermal junction therebetween. Depending upon the package geometry used and temperature resistance of components therein, a flat cover may also be active brazed directly to the aluminum nitride package. Alternatively, a metal seal ring is brazed to the aluminum nitride package which allows prior art roller welding, soldering or brazing of a lid to the seal ring after all devices are installed into the aluminum nitride package. The solid metal circuit and cover may be composed of nickel, yielding a very high temperature and corrosion resistant package. A circuit substrate may also be provided which interconnects to a second lead frame and also to a power electronic device within the package. The power electronic devices may preferably be placed within cavities in the molded base.

A method of assembling a package for electronic devices is also presented which includes molding an aluminum nitride housing with passageways passing entirely therethrough, forming a lead frame from solid metal into desired circuitry patterns, forming a hermetic chemical and mechanical bond between the lead frame and passageways with active braze, removing tie bars from the lead frame, mounting electronic devices in the housing, interconnecting electronic devices to the lead frame, and covering the housing to form a completely hermetic package around the electronic devices.

OBJECTS OF THE INVENTION

The primary object of the present invention is a package that combines the low intrinsic electrical resistance of copper or other similar metals with the excellent thermal conductivity and high reliability of aluminum nitride. Another object of the present invention is a package that delivers high reliability and high manufacturing yields. A further object of the present invention is a lower cost package than presently attainable with the prior art metal packages. Yet another object of the present invention is a hermetic package that is resistant to harsh and extreme environments. These and other objects which offer substantial inventive improvement over the prior art are achieved by the present invention as described and set forth hereinbelow.

DESCRIPTION OF THE PREFERRED EMBODIMENT

Figure 1:
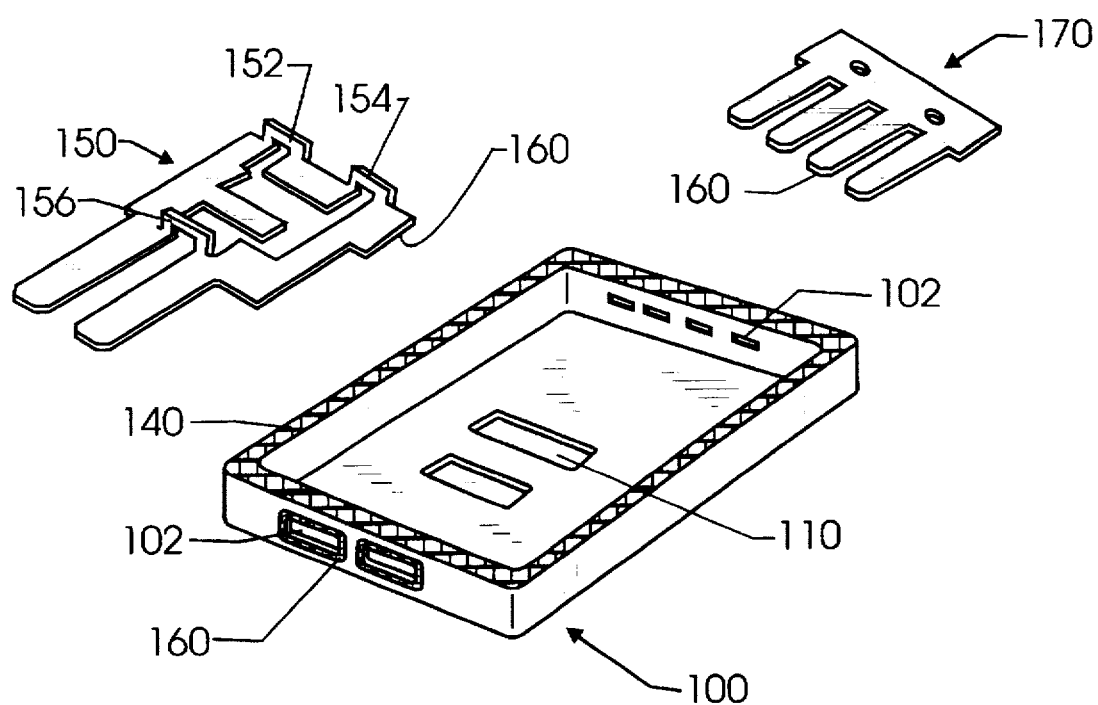
FIG. 1 illustrates the preferred embodiment of the inventions of an exploded view showing only the most essential features of the invention.
Figure 2:
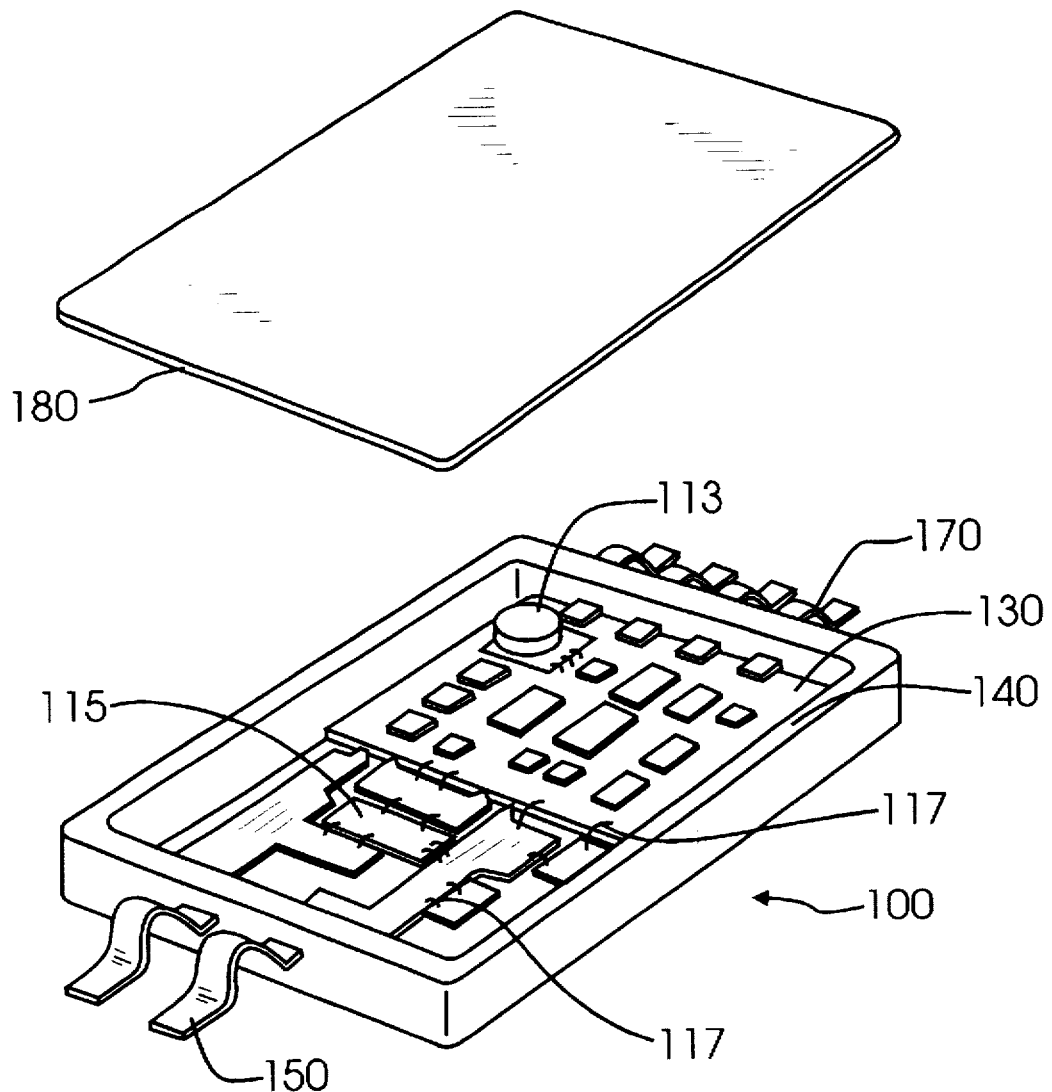
FIG. 2 illustrates the preferred embodiment of FIG. 1 in assembled form just before final package sealing.

FIGS. 1 and 2 illustrate the preferred embodiment of the invention by exploded and assembled views, respectively. For these figures, and all subsequent figures, the last two digits of the three digit reference numerals have been kept to match those of the other embodiments where the like numbered components perform like function. The first digit designates the embodiment and so is different for each embodiment.

As shown in FIG. 1, molded aluminum nitride housing 100 has been molded into a generally five-sided box having an open top. Aluminum nitride housing 100 is formed by those skilled in the art of molding ceramics, which is beyond the scope of the present invention. Aluminum nitride housing 100 has formed therein lead passageways 102 which extend completely through from the interior of housing 100 to the exterior. Also formed in aluminum nitride housing 100 are cavities 110 which are designed for later nesting of power dissipating components 115.

Through lead passageways 102 lead frames 150 and 170 are inserted. Lead frame 150 is illustrated as being larger than lead frame 170, and is therefore designed in this preferred embodiment to carry larger current than lead frame 170. Lead frame 150 has several small tie bars 152, 154 and 156 formed therein as shown in FIG. 1, which will be broken out and removed before the later assembly shown in FIG. 2.

While lead frames 150 and 170 may be formed by several suitable methods such as stamping or milling, chemical etching is the preferred method due to the level of detail and precision of feature that may be obtained. Lead frame 150 in particular is most preferably selected from one of several materials with good electrical and thermal conductivity, and also thermal expansion properties most compatible with aluminum nitride. Among these materials are copper, copper clad Invar, copper clad molybdenum, and nickel. While copper has a significantly greater coefficient of thermal expansion than aluminum nitride, the malleability of copper is thought to provide the necessary give and take through thermal cycling. Other materials such as silver and gold would be suitable also, though not likely cost effective in the preferred embodiment. Lead frame 170 will typically be formed from the same materials as lead frame 150 for ease of manufacture, though there is no requirement that they be of the same composition. In some applications, lead frame 170 may carry substantially less current than lead frame 150, thereby making available more suitable materials than would be available for use in lead frame 150.

Into passageways 102, around the open edge of housing 100, and onto the under side of lead frames 150 and 170 active braze 160 is screened. Active braze 160 is a metal brazing compound that includes a filler metal or metal alloy having nickel, silver, copper or gold in combination with an activator metal such as titanium, zirconium or hafnium. The exact active braze composition is dependent upon the specific material and geometry chosen for lead frames 150 and 170, and should be carefully matched thereto. Silver-titanium active brazes have been found to work with nickel, copper and copper-clad lead frames. However, for pure copper leads, the inventor has successfully used a titanium layer sputtered directly to the copper. The lead frame is subsequently positioned against the aluminum nitride and heated to the eutectic point of the copper-titanium alloy. The heating forms a suitable and effective copper-titanium active braze in situ. While the above active brazes have been discovered by the inventor and described herein, one knowledgeable in the art of active braze will select from a multitude of suitable compositions.

In practice, aluminum nitride housing 100 should be thermally annealed after molding to relieve any latent stresses. Any post-firing machining should be avoided if possible to prevent the formation of microcracks therein.

The bond that forms between active braze and aluminum nitride is so strong that any microcracks that are present in the ceramic will propagate and eventually fail after thermal or mechanical stress.

On the open edge of housing 100 a weld ring 140 is attached. In the preferred embodiment weld ring 140 is made of relatively thin nickel which will later be welded directly to cover 180. Preferably, weld ring 140, lead frame 150 and lead frame 170 are all brazed in a single brazing operation, thereby minimizing the number of extreme thermal cycles that any of these components or the housing 100 are exposed to.

Cavities 110 formed in aluminum nitride housing 100 are shaped to contain therein specific power components 115. Power components 115 may be transistors, silicon controlled rectifiers, diodes, triacs, integrated circuits or any other devices which, during their operation, dissipate significant power or for other reasons require good thermal connection to the exterior of the aluminum nitride housing 100. While not strictly essential, forming cavities 110 into aluminum nitride housing 100 achieves several benefits, including ensuring excellent thermal contact with housing 100. Cavities 110 also level the surfaces of the components 115 with lead frame 150, thereby simplifying wire bonding while simultaneously maintaining the wire bonds 117 as short as possible.

In the preferred embodiment of the invention, aluminum nitride housing 100 has been designed to hold both power components 115 and additional lower current circuitry 113 which is preassembled onto a circuit substrate 130. Circuit substrate 130 is placed within aluminum nitride housing 100 so as to just fit in the bottom, directly below where leads 170 pass through lead passageways 102. This configuration allows leads 170 to be directly connected to substrate 130, without any further forming operations. Wire bonds 117 may be used to connect substrate 130 to either power circuit components 115 or lead frame 150, as may be appropriate for the specific circuit used.

Once all components are placed within housing 100 and necessary wire-bonding completed, cover 180 may be installed onto weld ring 140. Cover 180 may be attached by soldering, brazing, welding or other similar technique, though roller welding is used in the preferred embodiment. The resulting package is hermetic and very thermally conductive. Where leads 150 and 170, cover 180, and weld ring 140 are fabricated from nickel, the resulting package is also very corrosion and temperature resistant. Nickel and aluminum nitride constructions have been tested at an operating temperature of 300 degrees Centigrade for use with high temperature IC chips, and have had limited testing at 500 degrees Centigrade. Completed packages can withstand assembly processes such as chip attach, soldering and wire bonding. No deterioration of hermeticity or mechanical integrity has been noted after such operations.

Figure 3:
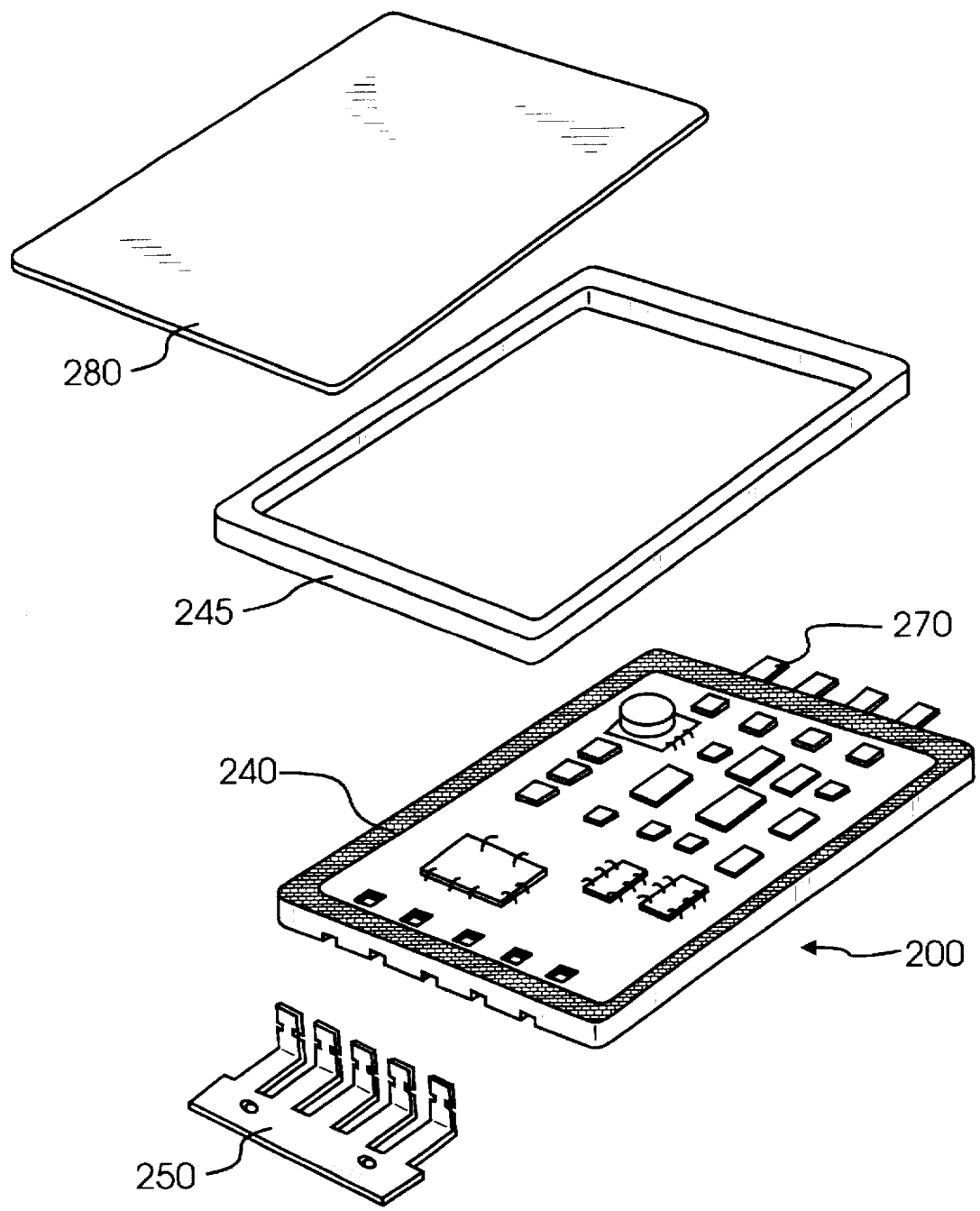
FIG. 3 illustrates an exploded view of a first alternative embodiment of the invention.
Figure 4:
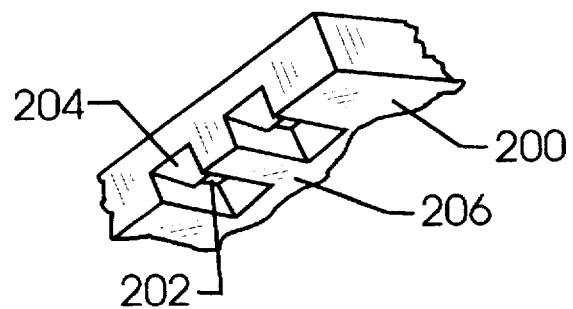
FIG. 4 illustrates a detailed view of the under side of the substrate of FIG. 3.

A second embodiment is illustrated in FIGS. 3 and 4. Molded aluminum nitride substrate 200 is much flatter than housing 100, having fewer dimensional features. In this embodiment, the vertical walls of the finished package are formed by seal ring 245. Seal ring 245 in this embodiment might, for example, be formed from Kovar (an iron, nickel, cobalt alloy). Cover 280 resembles cover 180 very much, and functions to close the finished package. Braze ring 240 is composed of active braze, and lead frames 250 and 270 pass through substrate 200 at lead frame passageways 202. In this embodiment, aluminum nitride substrate 200 is molded to include passageways 202, lead frame guide grooves 204, and lead frame separators 206 all shown in FIG. 4. As shown in FIG. 3, lead frames 250 and 270 are first formed to have ninety degree bends therein, next inserted into passageways 202 from the substrate 200 exterior, and then brazed into substrate 200. In a finishing operation, the individual leads of each lead frame on the substrate 200 interior are bent down to substrate 200.

Figure 5:
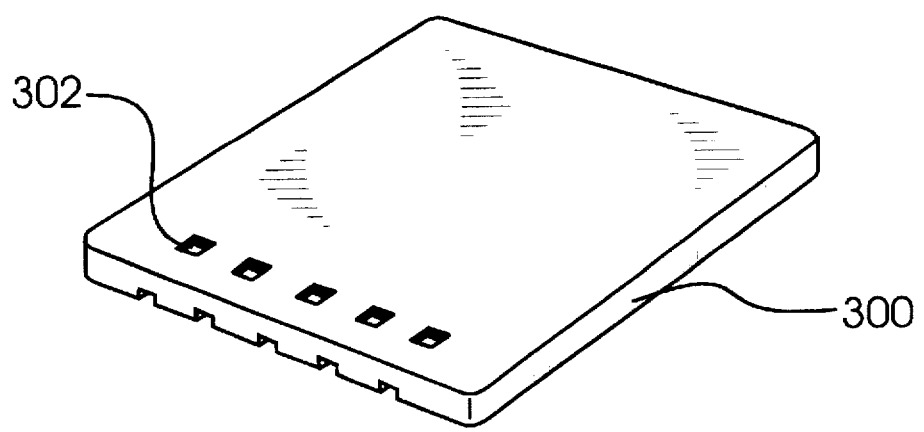
FIG. 5 illustrates a second alternative embodiment substrate of the invention.
Figure 6:
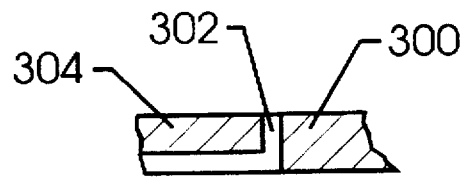
FIG. 6 illustrates the lead passageways by partial cross-section view.
Figure 7:
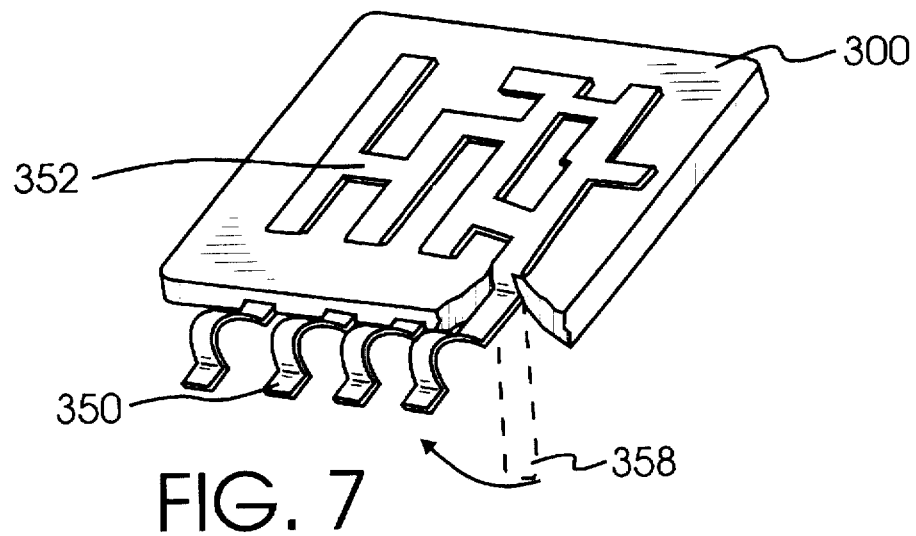
FIG. 7 illustrates the second alternative substrate of FIG. 5 with the lead frame inserted therein.

FIGS. 5–7 illustrate a third embodiment having a molded aluminum nitride substrate 300 which is relatively flat. Substrate 300 is also featured to include lead passageways 302, lead frame guide grooves 304, and lead frame separators 306 similar to those of the second embodiment. In this embodiment however, lead frame 350 is inserted from the component or interior side of substrate 300 and then later formed to extend coplanarly with substrate 300. As shown in FIG. 7, lead frame 300 is inserted with the leads extending downward through substrate 300, as shown by lead 358.

The structure may then be brazed, ensuring strong and reliable interconnection between lead frame 350 and substrate 300. Next, tie bar 352 and any other tie bars may be cut, separating the individual leads. The remaining assembly would follow the assembly of the second embodiment illustrated in FIGS. 3 and 4.

Figure 8:
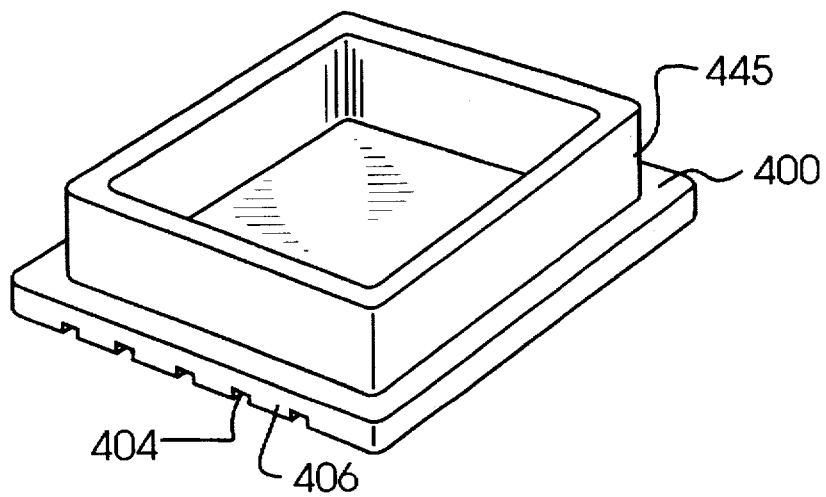
FIG. 8 illustrates a third alternative embodiment of the substrate having a bathtub configuration.
Figure 9:
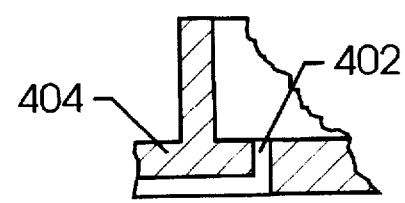
FIG. 9 illustrates the lead passageways by partial cross-section view.

FIGS. 8 and 9 illustrate a fourth embodiment of the invention. Substrate 400 may be very similar to either substrate 300 or 200, but in this embodiment, a vertical wall 445 is molded integral therewith to form a bathtub housing more closely resembling housing 100. Leads may be inserted through lead passageways 402 just as they were through either passageways 202 or 302, depending upon the particular configurations chosen by the designer.

While the foregoing description details preferred embodiments of the invention, no material limitations to the scope of the claimed invention are intended. Further, features and design alternatives that would be obvious to one of ordinary skill in the art are considered to be incorporated herein. The scope of the invention is set forth and particularly described in the claims hereinbelow.

I claim:

1. An aluminum nitride package, comprising:
   a) a molded aluminum nitride housing defining an interior and exterior surface, and having a passageway extending therebetween;
   b) a metal lead, extending from the exterior surface through the passageway and attached directly to the interior surface and passageway by active brazing material, thereby hermetically sealing the passageway;
   c) an electronic device electrically coupled to the metal lead and located adjacent to the interior surface; and
   d) a cover sealed to said aluminum nitride housing, whereby the electronic device is hermetically sealed within the aluminum nitride package.

2. The package of claim 1 wherein said metal lead and said cover are composed of nickel.

3. The package of claim 1 wherein said molded aluminum nitride housing further comprises vertical side walls extending perpendicular to a base of said housing, said passageway passing through said housing in said vertical side walls.

4. The package of claim 1 wherein said passageway passes through a base of said housing, said passageway connecting to a lead frame guide groove on said exterior surface of said housing.

5. The package of claim 1 further comprising a cavity in said molded aluminum nitride housing, said cavity dimensioned to surround said electronic device.

6. The package of claim 5 further comprising a second lead and a circuit substrate, said circuit substrate and said second lead electrically interconnected, said circuit substrate also electrically interconnected to said electronic device.

7. The package of claim 1 wherein said metal lead is adhered to said molded aluminum nitride housing on base a thereof.

8. The package of claim 7 wherein said passageway is normal to said base.

* * * * *